US012445097B2

(12) United States Patent
Eno et al.

(10) Patent No.: US 12,445,097 B2
(45) Date of Patent: Oct. 14, 2025

(54) AMPLIFIER CIRCUITRY

(71) Applicant: Cirrus Logic International Semiconductor Ltd., Edinburgh (GB)

(72) Inventors: Charles W. Eno, Austin, TX (US); Chandra B. Prakash, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 592 days.

(21) Appl. No.: 17/751,011

(22) Filed: May 23, 2022

(65) Prior Publication Data

US 2023/0147195 A1    May 11, 2023

Related U.S. Application Data

(60) Provisional application No. 63/275,994, filed on Nov. 5, 2021.

(51) Int. Cl.
*H03F 3/217*    (2006.01)
*H03F 3/213*    (2006.01)
(Continued)

(52) U.S. Cl.
CPC .......... *H03F 3/2173* (2013.01); *H03F 3/213* (2013.01); *H03F 3/45* (2013.01); *H03K 7/08* (2013.01)

(58) Field of Classification Search
CPC .......... H03F 3/2173; H03F 3/213; H03F 3/45; H03F 3/187; H03F 3/2171; H03K 7/08
(Continued)

(56) References Cited

U.S. PATENT DOCUMENTS 6,486,643 B2    11/2002 Liu
9,806,683 B2    10/2017 Buono
(Continued)

OTHER PUBLICATIONS

International Search Report and Written Opinion of the International Searching Authority, International Application No. PCT/GB2022/052574, mailed Jan. 23, 2023.

*Primary Examiner* — Andrea Lindgren Baltzell
*Assistant Examiner* — Khiem D Nguyen
(74) *Attorney, Agent, or Firm* — Jackson Walker L.L.P.

(57) ABSTRACT

Integrated circuitry implementing amplifier circuitry, the integrated circuitry comprising first amplifier circuitry and second amplifier circuitry, the first and second amplifier circuitry being configurable as first and second single-ended amplifiers or as a differential amplifier, wherein the first amplifier circuitry comprises: a first input stage; a first half-bridge output stage having an output coupled to a first output terminal of the integrated circuitry; a first feedback path coupling a first input of the first input stage to a first sense terminal of the first amplifier circuitry; a second feedback path coupling a second input of the first input stage to a second sense terminal of the first amplifier circuitry; and a first shunt resistor coupling the output of the first half-bridge output stage to the first feedback path, wherein the second amplifier circuitry comprises: a second input stage; and a second half-bridge output stage having an output coupled to a second output terminal of the integrated circuitry, and wherein the first amplifier circuitry further comprises a second shunt resistor coupling the second feedback path to a dedicated shunt resistor terminal of the integrated circuitry, such that the second shunt resistor is directly accessible from outside the integrated circuitry.

18 Claims, 9 Drawing Sheets

(51) Int. Cl.
*H03F 3/45* (2006.01)
*H03K 7/08* (2006.01)

(58) Field of Classification Search
USPC .......................................... 330/10, 251, 307
See application file for complete search history.

(56) References Cited

U.S. PATENT DOCUMENTS

2005/0024139 A1    2/2005  Botti et al.
2005/0025323 A1    2/2005  Botti et al.
2007/0139103 A1*   6/2007  Roeckner ................ H03F 1/305
                                                   330/10

* cited by examiner

AMPLIFIER CIRCUITRY

FIELD OF THE INVENTION

The present disclosure relates to amplifier circuitry, and in particular to integrated circuitry implementing amplifier circuitry.

BACKGROUND

Amplifier circuitry may be implemented by discrete electronic components mounted on a suitable substrate such as a printed circuit board (PCB), or may be implemented in integrated circuit (IC) devices. An IC device implementing amplifier circuitry may comprise two single ended half-bridge amplifiers for driving separate loads, but which may be reconfigured as a full-bridge differential amplifier for driving a single load.

SUMMARY

According to a first aspect, the invention provides integrated circuitry implementing amplifier circuitry, the integrated circuitry comprising first amplifier circuitry and second amplifier circuitry, the first and second amplifier circuitry being configurable as first and second single-ended amplifiers or as a differential amplifier, wherein the first amplifier circuitry comprises:
a first input stage;
a first half-bridge output stage having an output coupled to a first output terminal of the integrated circuitry;
a first feedback path coupling a first input of the first input stage to a first sense terminal of the first amplifier circuitry;
a second feedback path coupling a second input of the first input stage to a second sense terminal of the first amplifier circuitry; and
a first shunt resistor coupling the output of the first half-bridge output stage to the first feedback path,
wherein the second amplifier circuitry comprises:
a second input stage; and
a second half-bridge output stage having an output coupled to a second output terminal of the integrated circuitry,
and wherein the first amplifier circuitry further comprises
a second shunt resistor coupling the second feedback path to a dedicated shunt resistor terminal of the integrated circuitry, such that the second shunt resistor is directly accessible from outside the integrated circuitry.

The first amplifier circuitry may comprise a first return path switch in a first return path, for selectively coupling an amplifier return terminal of the first amplifier circuitry to a ground or reference voltage supply terminal of the first amplifier circuitry.

The second amplifier circuitry may comprise a second return path switch in a second return path for selectively coupling an amplifier return terminal of the second amplifier circuitry to a ground or reference voltage supply terminal of the second amplifier circuitry.

The first amplifier circuitry may comprise load sensing circuitry coupled to the amplifier return terminal of the first circuitry, for determining a parameter of a load coupled to the first output terminal.

The second amplifier circuitry may comprise load sensing circuitry coupled to the amplifier return terminal of the second circuitry, for determining a parameter of a load coupled to the second output terminal.

The first amplifier circuitry may comprise Class D amplifier circuitry.

The first input stage may comprise pulse width modulator circuitry.

The second amplifier circuitry may further comprise:
a second input stage;
a third feedback path coupling a first input of the second input stage to a first sense terminal of the second amplifier circuitry;
a fourth feedback path coupling a second input of the second input stage to a second sense terminal of the second amplifier circuitry;
a third shunt resistor coupling the output of the second half-bridge output stage to the third feedback path; and
a second shunt resistor coupling the second feedback path to an amplifier return terminal of the second amplifier circuitry.

The second amplifier circuitry may comprise class D amplifier circuitry.

The second input stage may comprise pulse width modulator circuitry.

In operation of the integrated circuitry when configured as a differential amplifier, the first input stage may be configured to supply input signals to the first half-bridge output stage and to the second half-bridge output stage.

In operation of the integrated circuitry when configured as first and second single-ended amplifiers, the first input stage may be configured to supply an input signal to the first half-bridge output stage and the second input stage may be configured to supply an input signal to the second half-bridge output stage.

According to a second aspect, the invention provides reconfigurable amplifier circuitry comprising:
a first amplifier comprising:
a first input stage;
a first output stage;
a first feedback path coupled to a first input of the first input stage;
a second feedback path coupled to a second input of the first input stage;
a first resistor coupling an output node of the first output stage to the first feedback path; and
a second resistor coupled between a dedicated resistor node and the second feedback path; and
a second amplifier comprising:
a second input stage;
a second output stage;
a third feedback path coupled to a first input of the second input stage;
a fourth feedback path coupled to a second input of the first input stage;
a third resistor coupling an output node of the second output stage to the third feedback path; and
a fourth resistor coupled between an amplifier return terminal and the second feedback path;
wherein the reconfigurable amplifier circuitry is operable in:
a first configuration as first and second amplifiers for driving respective first and second loads coupled to the respective output nodes of the first and second output stages; and
a second configuration for differentially driving a single load coupled between the respective output nodes of the first and second output stages, wherein in the second configuration the output node of the second output stage is coupled to the dedicated resistor node of the first amplifier circuitry.

According to a third aspect, the invention provides reconfigurable amplifier circuitry comprising:
first amplifier circuitry comprising a first input stage, a first output stage and a feedback path coupling an output node of the first output stage to a first input of the first input stage, wherein the feedback path comprises a first shunt resistor;
second amplifier circuitry comprising a second input stage, a second output stage and a feedback path coupling an output node of the second output stage to a first input of the second input stage, wherein the feedback path comprises a second shunt resistor; and
a selectable feedback path coupling the output node of the second output stage to a second input of the first input stage,
wherein:
in a first configuration the reconfigurable amplifier circuitry is operable as first and second single-ended amplifiers for driving respective first and second loads, wherein in the first configuration the selectable feedback path is disabled, the first input stage is operative to supply a first input signal to the first output stage and the second input stage is operative to supply a second input signal to the second output stage; and
in a second configuration the reconfigurable amplifier circuitry is operable as a differential amplifier for driving a single load, wherein in the second configuration the selectable feedback path is enabled and the first input stage is operative to supply input signals to the first and second output stages.

The first amplifier circuitry may comprise a selectable second feedback path between a first amplifier return terminal and the second input of the first input stage, wherein in the first configuration the selectable second feedback path is enabled, and wherein in the second configuration the selectable second feedback path is disabled.

According to a fourth aspect the invention provides an integrated circuit comprising reconfigurable amplifier circuitry according to the second aspect or the third aspect.

According to a fifth aspect, the invention provides an integrated circuit comprising first amplifier circuitry, second amplifier circuitry and a shunt resistor associated with the first amplifier circuitry, wherein the first amplifier circuitry and the second amplifier circuitry are reconfigurable to implement either: separate first and second single-ended amplifier circuitry; or differential amplifier circuitry, and wherein the integrated circuit includes a dedicated resistor terminal to permit external access to the shunt resistor.

According to a sixth aspect, the invention provides a host device comprising integrated circuitry according to the first aspect.

The host device may comprise a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console, a VR or AR device, a mobile telephone, a portable audio player or other portable device.

BRIEF DESCRIPTION OF THE DRAWINGS

Embodiments of the invention will now be described, strictly by way of example only, with reference to the accompanying drawings, of which.

DETAILED DESCRIPTION

Figure 1:
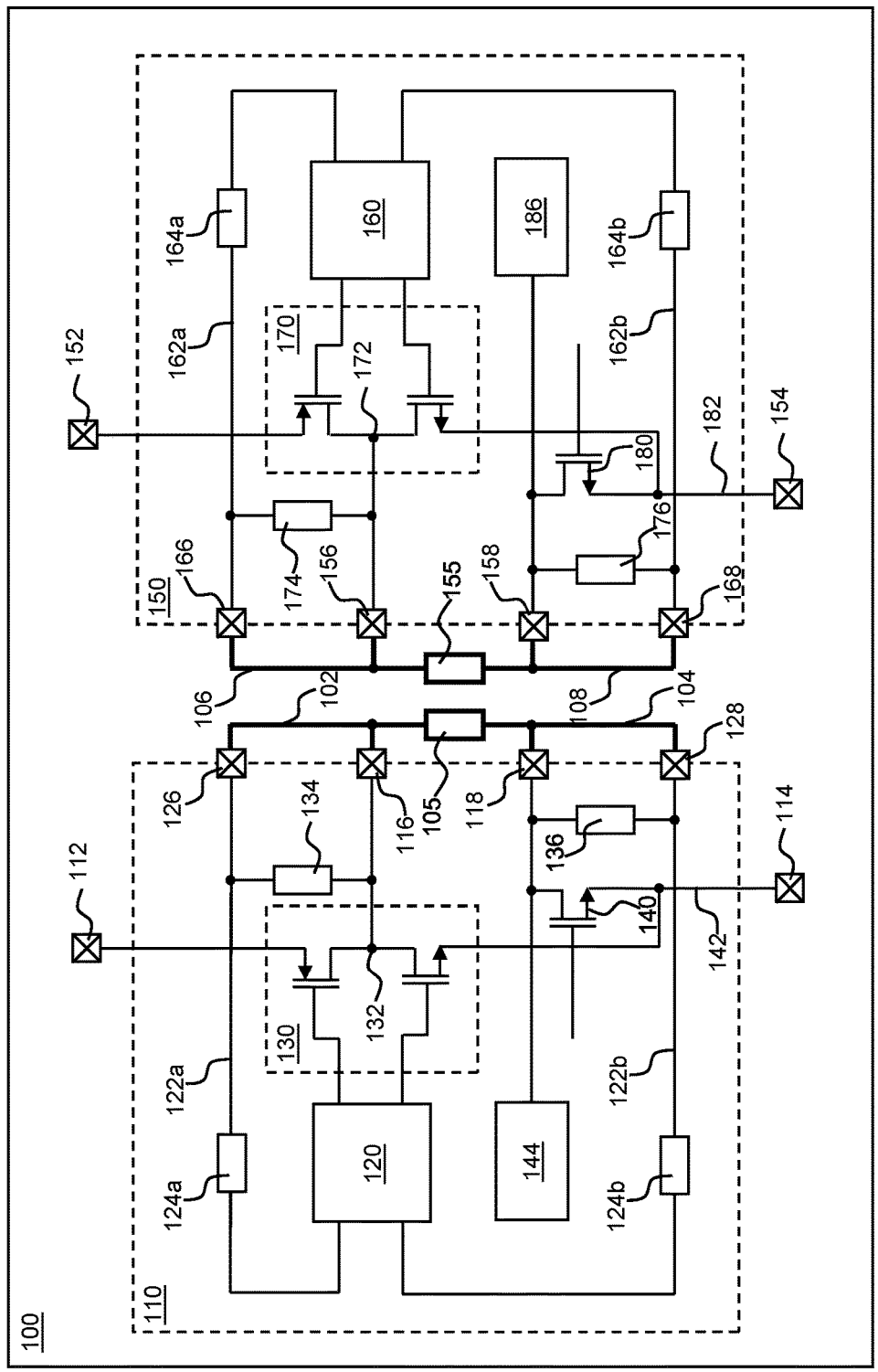
FIG. 1 is a schematic representation of an integrated circuit implementation of amplifier circuitry comprising two single ended half-bridge amplifiers.
Figure 2:
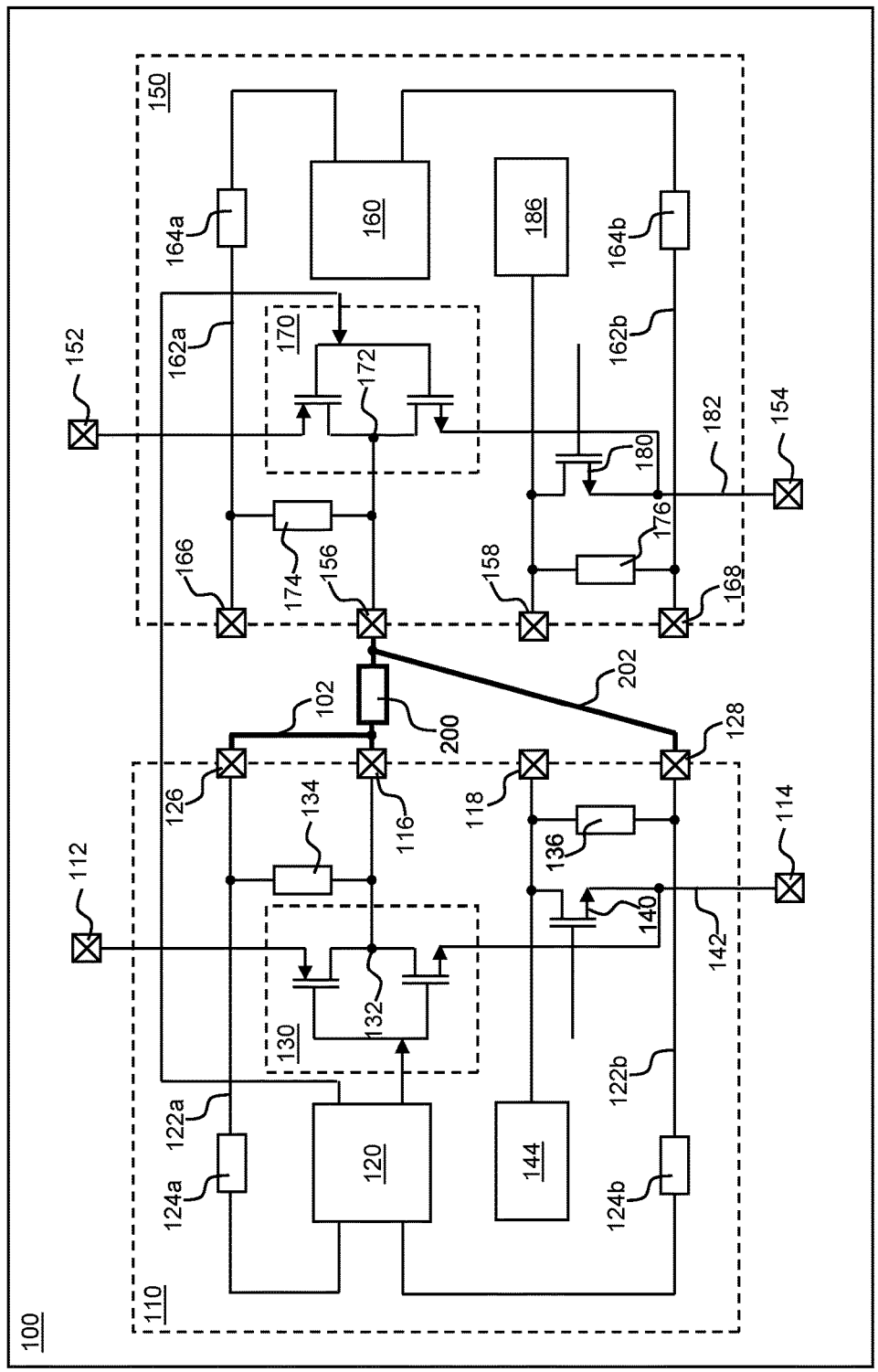
FIG. 2 is a schematic representation of the integrated circuit of FIG. 1 reconfigured as a full-bridge differential amplifier.

Referring first to FIG. 1, an integrated circuit (IC) implementing amplifier circuitry is shown generally at 100. The IC 100 in this example comprises first amplifier circuitry 110 (shown in dashed outline) and second amplifier circuitry 150 (also shown in dashed outline), which are configurable as two separate single ended half-bridge amplifiers (as shown in FIG. 1), or as a single differential full-bridge amplifier (as shown in FIG. 2).

The first amplifier circuitry 110 comprises a first input stage 120 and a first half-bridge output stage 130. Outputs of the first input stage 120 are coupled to inputs of the first half-bridge output stage.

The first input stage 120 may comprise PWM modulator circuitry, for example.

In the example shown in FIG. 1 the first half-bridge output stage 130 comprises first and second complementary MOSFET devices coupled together in a half-bridge arrangement of a kind that will be familiar to those of ordinary skill in the art.

The first half-bridge output stage 130 is coupled to a supply voltage terminal (e.g. a pin, pad ball or the like) 112 and to a ground or other reference voltage supply terminal 114 of the first amplifier circuitry 110. An output node 132 of the first half-bridge output stage 130 is coupled to a first amplifier output terminal (e.g. a pin, pad ball or the like) 116 of the first amplifier circuitry 110.

A first feedback path 122a comprising a first feedback resistor 124a couples a first input of the first input stage 120 to a first voltage sense terminal 126 of the first amplifier circuitry 110. A first shunt resistor 134 is coupled, at a first terminal thereof, to the first feedback path 122a and, at a second terminal thereof, to the output node 132 of the first half-bridge output stage 130.

A second feedback path 122b comprising a second feedback resistor 124b couples a second input of the first input stage 120 to a second voltage sense terminal 128 of the first amplifier circuitry 110. A second shunt resistor 136 is coupled between the second feedback path 122b and a first amplifier return terminal 118 of the first amplifier circuitry 110.

In the example illustrated in FIG. 1 the first amplifier circuitry 110 further comprises a return path switch 140 in a return path 142 between the first amplifier return terminal 118 and the ground or other reference voltage supply terminal 114. The return path switch 140 can be closed (e.g. in a load driving mode of operation of the first amplifier circuitry 110) to couple the first amplifier return terminal 118 to the ground or other reference voltage supply terminal 114, or opened (e.g. in a load sensing mode of operation of the first amplifier circuitry 110) to decouple the first amplifier return terminal 118 from the ground or other reference supply terminal 114. In other examples, however, the return path switch 140 may be omitted.

The first amplifier circuitry 110 may further include load sensing circuitry 144, coupled to the first amplifier return terminal 118 and configured to detect, estimate or otherwise determine a parameter, property or characteristic (e.g. an impedance, inductance, resistance, capacitance or the like) of a first load 105 which is external to the IC 100 and which, in use of the IC 100, is coupled between the first amplifier output terminal 116 and the first amplifier return terminal 118.

The second amplifier circuitry 150 is similar to the first amplifier circuitry 110, and comprises a second input stage 160 and a second half-bridge output stage 170. Outputs of the second input stage 160 are coupled to inputs of the second half-bridge output stage 170.

The second input stage 160 may comprise PWM modulator circuitry, for example.

In the example shown in FIG. 1 the second half-bridge output stage 170 comprises first and second complementary MOSFET devices coupled together in a half-bridge arrangement of a kind that will be familiar to those of ordinary skill in the art. The second half-bridge output stage 170 is coupled to a supply voltage terminal (e.g. a pin, pad ball or the like) 152 and to a ground or other reference voltage supply terminal 154 of the second amplifier circuitry 150. An output node 172 of the second half-bridge output stage 170 is coupled to a second amplifier output terminal (e.g. a pin, pad ball or the like) 156 of the second amplifier circuitry 150.

A third feedback path 162a comprising a third feedback resistor 164a couples a first input of the second input stage 160 to a first voltage sense terminal 166 of the second amplifier circuitry 150. A third shunt resistor 174 is coupled, at a first terminal, to the third feedback path 162a and, at a second terminal, to the output node 172 of the second half-bridge output stage 170.

A fourth feedback path 162b comprising a fourth feedback resistor 164b couples a second input of the second input stage 160 to a second voltage sense terminal 168 of the second amplifier circuitry 150. A fourth shunt resistor 176 is coupled between the fourth feedback path 162b and a second amplifier return terminal 158 of the second amplifier circuitry 150.

In the example illustrated in FIG. 1 the second amplifier circuitry 150 further comprises a return path switch 180 in a return path 182 between the second amplifier return terminal 158 and the ground or other reference voltage supply terminal 154. The return path switch 180 can be closed (e.g. in a load driving mode of operation of the second amplifier circuitry 150) to couple the second amplifier return terminal 158 to the ground or other reference voltage supply terminal 154, or opened (e.g. in a load sensing mode of operation of the second amplifier circuitry 150) to decouple the second amplifier return terminal 158 from the ground or other reference supply terminal 154. In other examples, however, the return path switch 180 may be omitted.

The second amplifier circuitry 150 may further include load sensing circuitry 186, coupled to the second amplifier return terminal 158 and configured to detect, estimate or otherwise determine a parameter, property or characteristic (e.g. an impedance, inductance, resistance, capacitance or the like) of a second load 155 which is external to the IC 100 and which, in use of the IC 100, is coupled between the second amplifier output terminal 156 and the second amplifier return terminal 158.

In operation of the first amplifier circuitry 110 as a single-ended amplifier to drive a first external load 105 (e.g. an audio transducer such as a speaker or a haptics transducer such as a linear resonant actuator), the first external load 105 is coupled between the first amplifier output terminal 116 and the first amplifier return terminal 118 of the first amplifier circuitry 110.

In some applications, a first link or connection 102 external to the IC 100 may be provided to couple the first amplifier output terminal 116 to the first voltage sense terminal 126, and a second link or connection 104 external to the IC 100 may be provided to couple the first amplifier return terminal to the second voltage sense terminal 128. Thus, a feedback path containing only the first feedback resistor 124a may be established between the first amplifier output terminal 116 and the first input of the first input stage 120, and a feedback path containing only the second feedback resistor 124b may be established between the first amplifier return terminal 118 and the second input of the first input stage 120.

In other applications the first and second links or connections 102, 104 external to the IC 100 may not be provided. In such applications, or in a situation in which the first and second links or connections 102, 104 are broken, a feedback path containing the first shunt resistor 134 and the first feedback resistor 124a is provided between the first amplifier output terminal 116 of the first amplifier circuitry 110 and the first input of the first input stage 120. Similarly, a feedback path containing the second shunt resistor 136 and the second feedback resistor 124b is provided between the first amplifier return terminal 118 and the second input of the first input stage 120.

Thus, in operation of the first amplifier circuitry 110, the first and second shunt resistors 134, 136 ensure that feedback paths are provided between the first amplifier output terminal 116 and the first input of the first input stage 120 and between the first amplifier return terminal 118 and the second input of the first input stage 120. Thus, the first amplifier circuitry 110 always has a closed loop configuration, regardless of whether the first and second external links or connections 102, 104 are provided, because the first and second shunt resistors 134, 136 couple the first and second voltage sense terminals 126, 128 to the respective first and second feedback paths 122a, 122b.

The second amplifier circuitry 150 can be configured in the same manner to operate as a single-ended amplifier to drive a second external load 155 coupled between the second amplifier output terminal 156 and the second amplifier return terminal 158. A third external link or connection 106 may be provided between the second amplifier output terminal 156 and the first voltage sense terminal 166 of the second amplifier circuitry 150 to provide a feedback path containing only the third feedback resistor 164a between the second amplifier output terminal 156 and the first input of the second input stage 160. A fourth external link or connection 108 may also be provided between the second amplifier return terminal 158 and the second voltage sense terminal 168 of the second amplifier circuitry 150, to provide a feedback path containing only the fourth feedback resistor 164b between the second amplifier return terminal 158 and the second input of the second input stage 160.

Alternatively, if the third and fourth external links or connections 106, 108 are not provided, or are broken, a feedback path containing the third shunt resistor 174 and the third feedback resistor 164a is provided between the second amplifier output terminal 156 of the second amplifier circuitry 150 and the first input of the second input stage 160. Similarly, a feedback path containing the fourth shunt resistor 176 and the fourth feedback resistor 164b is provided between the second amplifier return terminal 158 and the second input of the second input stage 160 of the second amplifier circuitry 150, to ensure that the second amplifier circuitry 150 always operates in a closed-loop configuration.

FIG. 2 is a schematic representation of the IC 100 of FIG. 1 reconfigured as a differential full-bridge amplifier for driving a single load 200.

As can be seen in FIG. 2, in this configuration the load 200 (which is external to the IC 100) is coupled between the first amplifier output terminal 116 and the second amplifier output terminal 156, and the first input stage 120 provides input signals to both the first half-bridge output stage 130 and the second half-bridge output stage 170, such that the external load 200 is driven by a differential output signal pair provided by the first and second first half-bridge output stages 130, 170. The second input stage 160 is not used.

A first external link or connection 102 is provided to couple the first amplifier output terminal 116 to the first voltage sense terminal 126, thus providing a feedback path (containing the first feedback resistor 124a of the first amplifier circuitry 110) between the first amplifier output terminal 116 and the first input of the first input stage 120. A fifth external link or connection 202 is provided to couple the second amplifier output terminal 156 to the second voltage sense terminal 128 of the first amplifier circuitry 110, thus providing a feedback path (containing the second feedback resistor 124b of the first amplifier circuitry 110) between the second amplifier output terminal 156 and the second input of the first input stage 120.

In this configuration the second shunt resistor 136 is isolated and thus cannot form part of a feedback path between the load 200 and the second input of the first input stage 120. Thus, if the fifth external link or connection 202 is broken or not provided, the first amplifier circuitry 110 will adopt an open-loop configuration, which may lead to problems of instability and the like.

Figure 3:
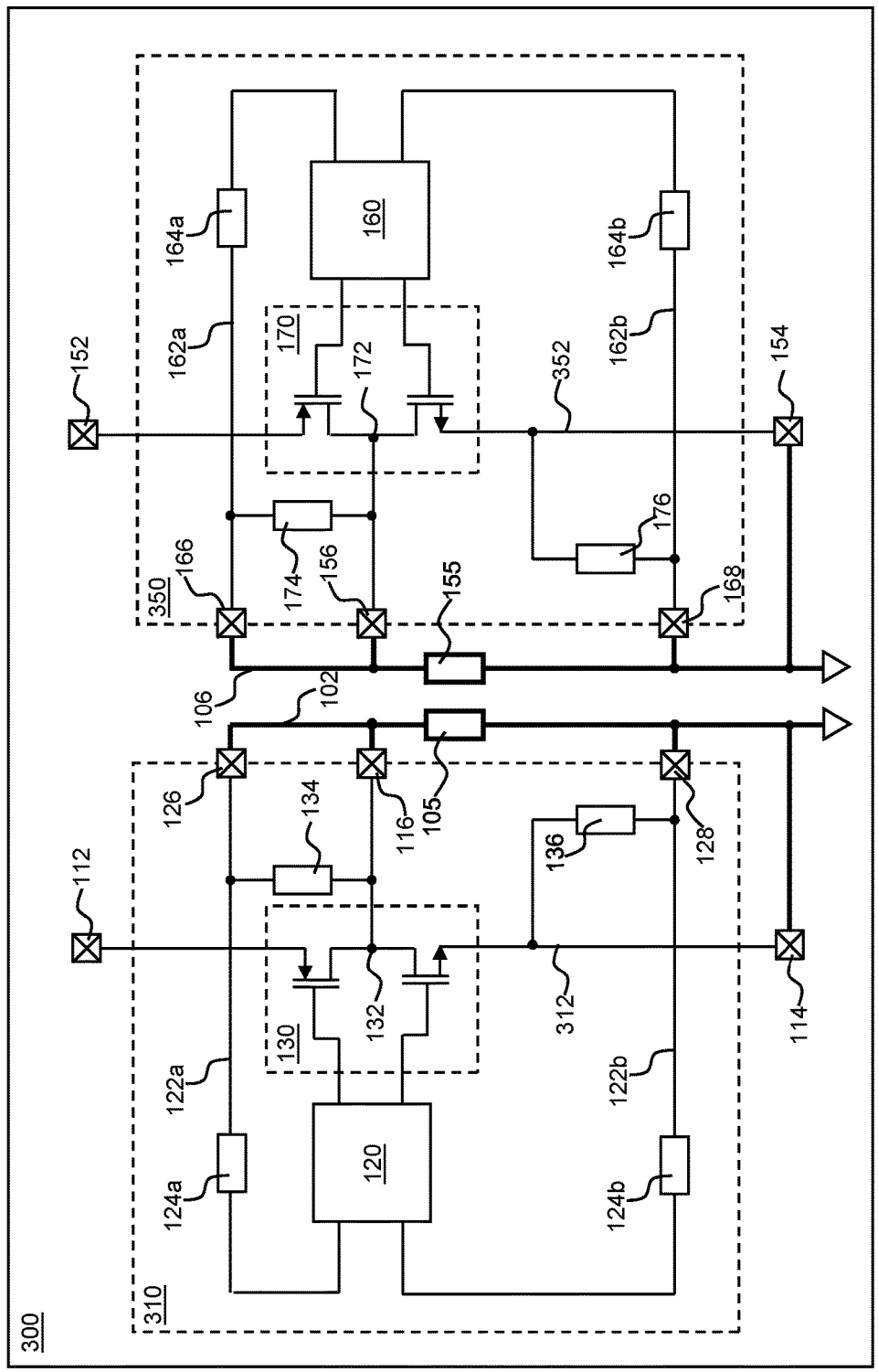
FIG. 3 is a schematic representation of an alternative integrated circuit implementation of amplifier circuitry comprising two single ended half-bridge amplifiers.

FIG. 3 is a schematic diagram illustrating an alternative IC implementation of amplifier circuitry. The IC, shown generally at 300 in FIG. 3, includes a number of features in common with the IC 100 of FIGS. 1 and 2. Such common features are denoted by common reference numerals in FIGS. 1, 2 and 3, and will not be described again in detail here for the sake of clarity and brevity.

The IC 300 comprises first and second amplifier circuitry 310, 350 that are similar to the first and second amplifier circuitry 110, 150 described above with reference to FIG. 1.

The first amplifier circuitry 310 differs from the first amplifier circuitry 110 of FIG. 1 in that there is no first amplifier return terminal 118, and no return path switch 140 is provided. Instead, the first half-bridge output stage 130 is coupled directly to the ground or other reference voltage supply terminal 114 of the first amplifier circuitry 110 by a first amplifier ground path 312. A first terminal of the second shunt resistor 136 of the first amplifier circuitry 310 is coupled to the first amplifier ground path 312, and a second terminal of the second shunt resistor 136 is coupled to the second voltage sense terminal 128 of the first amplifier circuitry 310.

Similarly, the second amplifier circuitry 350 differs from the second amplifier circuitry 150 of FIG. 1 in that there is no second amplifier return terminal 158, and no return path switch 180 is provided. Instead, the second half-bridge output stage 170 is coupled directly to the ground or other reference voltage supply terminal 154 of the second amplifier circuitry 150 by a second amplifier ground path 352. A first terminal of the fourth shunt resistor 176 of the second amplifier circuitry 350 is coupled to the second amplifier ground path 352, and a second terminal of the fourth shunt resistor 176 is coupled to the second voltage sense terminal 168 of the second amplifier circuitry 350.

In use of the IC 300 in the configuration shown in FIG. 3 to provide two single-ended half-bridge amplifiers for driving separate loads, a first terminal of a first load 105 (e.g. a transducer such as a speaker or an actuator such as a linear resonant actuator) external to the IC 100 is coupled to the first amplifier output terminal 116. A second terminal of the first external load 105 is coupled to the ground or other reference voltage supply terminal 114 of the first amplifier circuitry 310. The second terminal of the first external load 105 is also coupled to the second voltage sense terminal 128 of the first amplifier circuitry 310. A first external link or connection 102 may be provided, coupled between the first amplifier output terminal 116 and the first voltage sense terminal 126 of the first amplifier circuitry 310.

Thus, a feedback path is provided from the output node 132 of the first half-bridge output stage 130 to the first input of the first input stage 120, either via the first external link or connection 102 (if provided) and the first feedback resistor 124a or via the first shunt resistor 134 and the first feedback resistor 124a if the first external link or connection 102 is not provided.

A feedback path is also provided from the second terminal of the first load 105 to the second input of the first input stage 120, via the second feedback resistor 124b.

Similarly, a first terminal of a second load 155 external to the IC 100 is coupled to the second amplifier output terminal 156, and a second terminal of the second external load 155 is coupled to the ground or other reference voltage supply terminal 154 of the second amplifier circuitry 350. The second terminal of the second external load 155 is also coupled to the second voltage sense terminal 168 of the second amplifier circuitry 350. A third external link or connection 106 may be provided, coupled between the second amplifier output terminal 156 and the first voltage sense terminal 166 of the second amplifier circuitry 350.

Thus, a feedback path is provided from the output node 172 of the second half-bridge output stage 170 to the first input of the second input stage 160, either via the third external link or connection 106 (if provided) and the third feedback resistor 164a or via the third shunt resistor 174 and the third feedback resistor 164a if the third external link or connection 106 is not provided.

A feedback path is also provided from the second terminal of the second external load 155 to the second input of the second input stage 160, via the fourth feedback resistor 164b.

Figure 4:
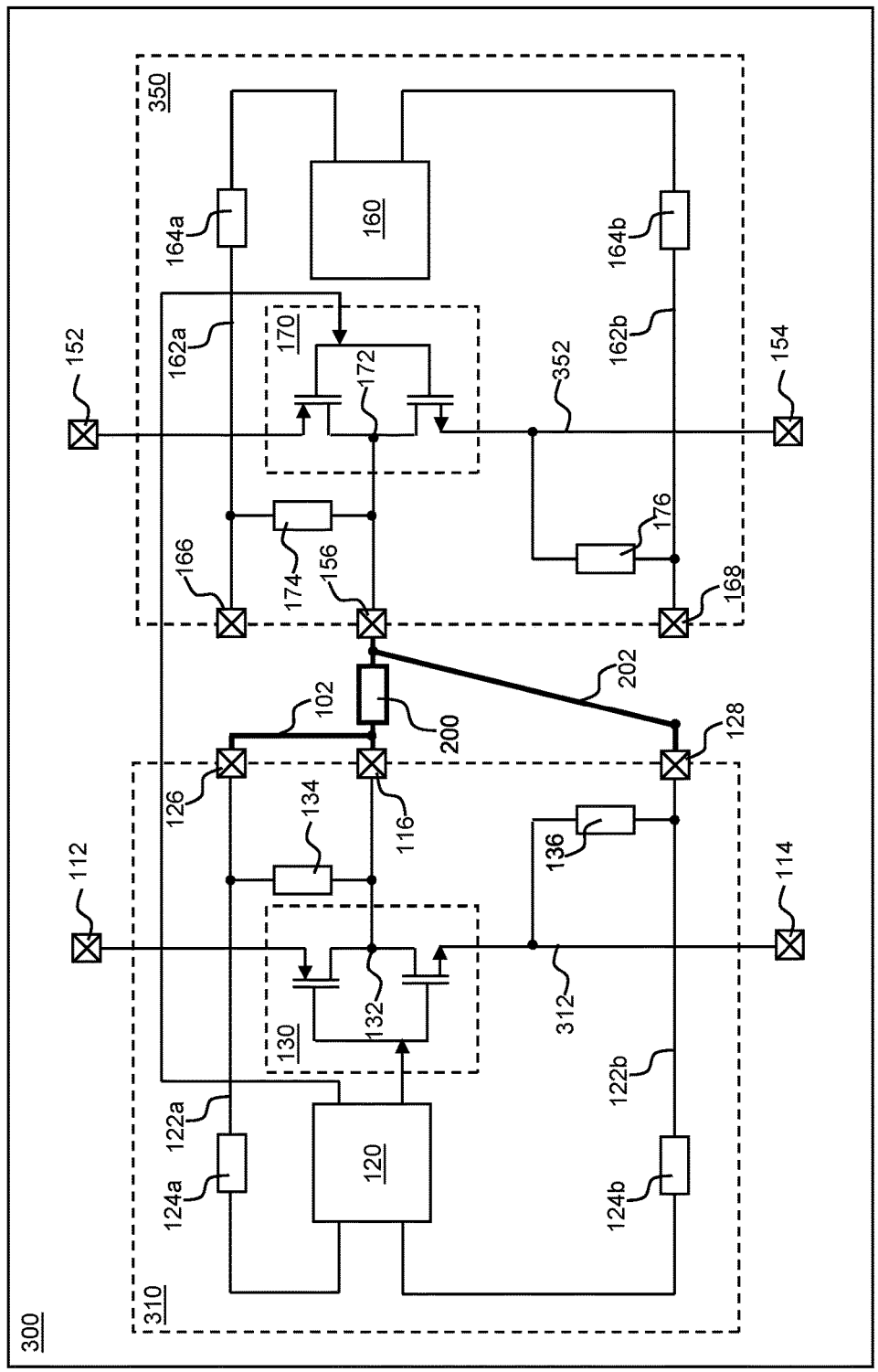
FIG. 4 is a schematic representation of the integrated circuit of FIG. 3 reconfigured as a full-bridge differential amplifier.

FIG. 4 is a schematic representation of the IC 300 of FIG. 3 reconfigured as a differential full-bridge amplifier for driving a single load 200.

As can be seen in FIG. 4, in this configuration the load 200 is coupled between the first amplifier output terminal 116 and the second amplifier output terminal 156, and the first input stage 120 provides signals to both the first half-bridge output stage 130 and the second half-bridge output stage 170, such that the load 200 is driven by a differential output signal pair provided by the first and second first half-bridge output stages 130, 170. The second input stage 160 is not used.

A first external link or connection 102 is provided to couple the first amplifier output terminal 116 to the first voltage sense terminal 126 of the first amplifier circuitry 310, thus providing a feedback path (containing the first feedback resistor 124a of the first amplifier circuitry 310) between the first amplifier output terminal 116 and the first input of the first input stage 120. A fifth external link or connection 202 is provided to couple the second amplifier output terminal 156 to the second voltage sense terminal 128 of the first amplifier circuitry 310, thus providing a feedback path (containing the second feedback resistor 124b of the first amplifier circuitry 310) between the second amplifier output terminal 156 and the second input of the first input stage 120.

In this configuration the second shunt resistor 136 cannot form part of a feedback path between the load 200 and the second input of the first input stage 120. Thus, if the fifth external link or connection 202 is broken or not provided, the first amplifier circuitry 310 adopts an open-loop configuration, which may lead to problems of instability and the like.

Figure 5:
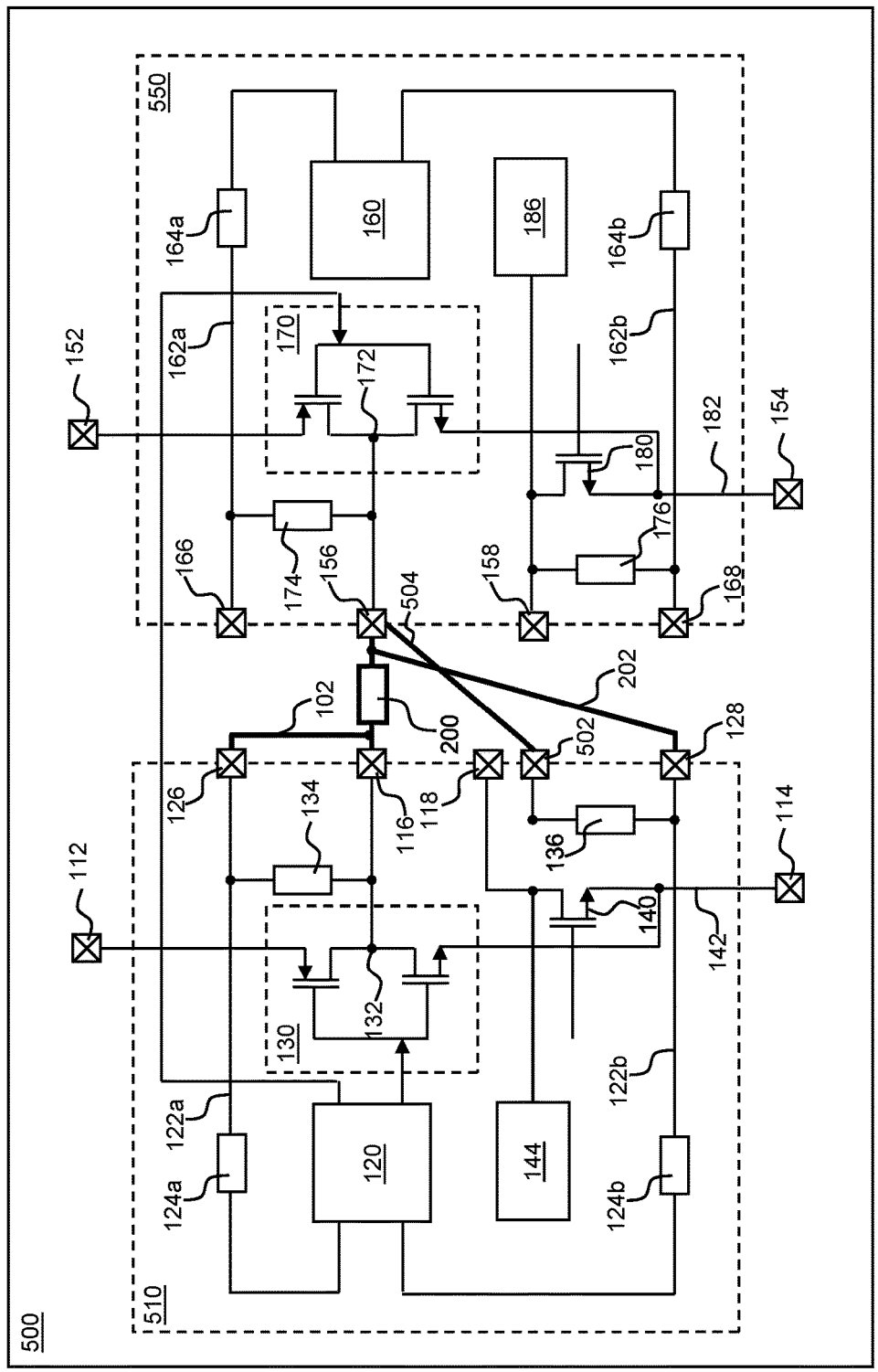
FIG. 5 is a schematic representation of an alternative integrated circuit implementation of amplifier circuitry configured as a full-bridge differential amplifier according to the present disclosure.

FIG. 5 is a schematic diagram illustrating an alternative IC implementation of amplifier circuitry configured as a differential full-bridge amplifier for driving a single load 200. The IC, shown generally at 500 in FIG. 5, includes a number of features in common with the IC 100 of FIGS. 1 and 2. Such common features are denoted by common reference numerals in FIGS. 1, 2 and 5, and will not be described again in detail here for the sake of clarity and brevity.

The IC 500 comprises first and second amplifier circuitry 510, 550 that are similar to the first and second amplifier circuitry 110, 150 described above with reference to FIG. 1.

In the IC 500 of FIG. 5, the second shunt resistor 136 of the first amplifier circuitry 510 is not coupled to the first amplifier return terminal 118 of the first amplifier circuitry 110.

Instead, the first amplifier circuitry 110 includes a dedicated shunt resistor terminal 502 (e.g. a pin, pad, ball or the like) to which only a first terminal of the second shunt resistor 136 is coupled, such that the first terminal of the second shunt resistor 136 is directly accessible from outside the IC 500.

A second terminal of the second shunt resistor 136 is coupled to the second voltage sense terminal 128 of the first amplifier circuitry 110, as in the implementation shown in FIGS. 1 and 2.

The return path switch 140 (if provided) is coupled between the first amplifier return terminal 118 and the ground or other reference voltage supply terminal 114 in the same way as in the implementation shown in FIGS. 1 and 2, and operates in the manner described above to couple the first amplifier return terminal 118 to the ground or other reference voltage supply terminal 114 in a closed state, or to decouple the first amplifier return terminal 118 from the ground or other reference supply terminal 114 in an open state.

In the differential configuration shown in FIG. 5, a fifth external link or connection 202 is provided to couple the second amplifier output terminal 156 of the second amplifier circuitry 550 to the second voltage sense terminal 128 of the first amplifier circuitry 510 (as in the differential configuration of the IC 100 shown in FIG. 2), to provide a feedback path between the second amplifier output terminal 156 and the second input of the first input stage 120.

Additionally, the shunt resistor terminal 502 is coupled to the second amplifier output terminal 156 of the second amplifier circuitry 550 by a sixth external link or connection 504.

Thus, in the implementation shown in FIG. 5, in the event that the fifth external link or connection 202 fails or is not provided for any reason, a feedback path between the second amplifier output terminal 156 and the second input of the first input stage 120 still exists, via the sixth external link or connection 504 and the second shunt resistor 136 of the first amplifier circuitry 510. Accordingly, in the differential configuration shown in FIG. 5 the first amplifier circuitry 510 always operates in a closed loop configuration.

In operation of the IC 500 in the differential configuration shown in FIG. 5 the external load 200 is coupled between the first amplifier output terminal 116 and the second amplifier output terminal 156, and the first input stage 120 provides input signals to both the first half-bridge output stage 130 and the second half-bridge output stage 170, such that the external load 200 is driven by a differential output signal pair provided by the first and second first half-bridge output stages 130, 170. The second input stage 160 is not used.

Figure 6:
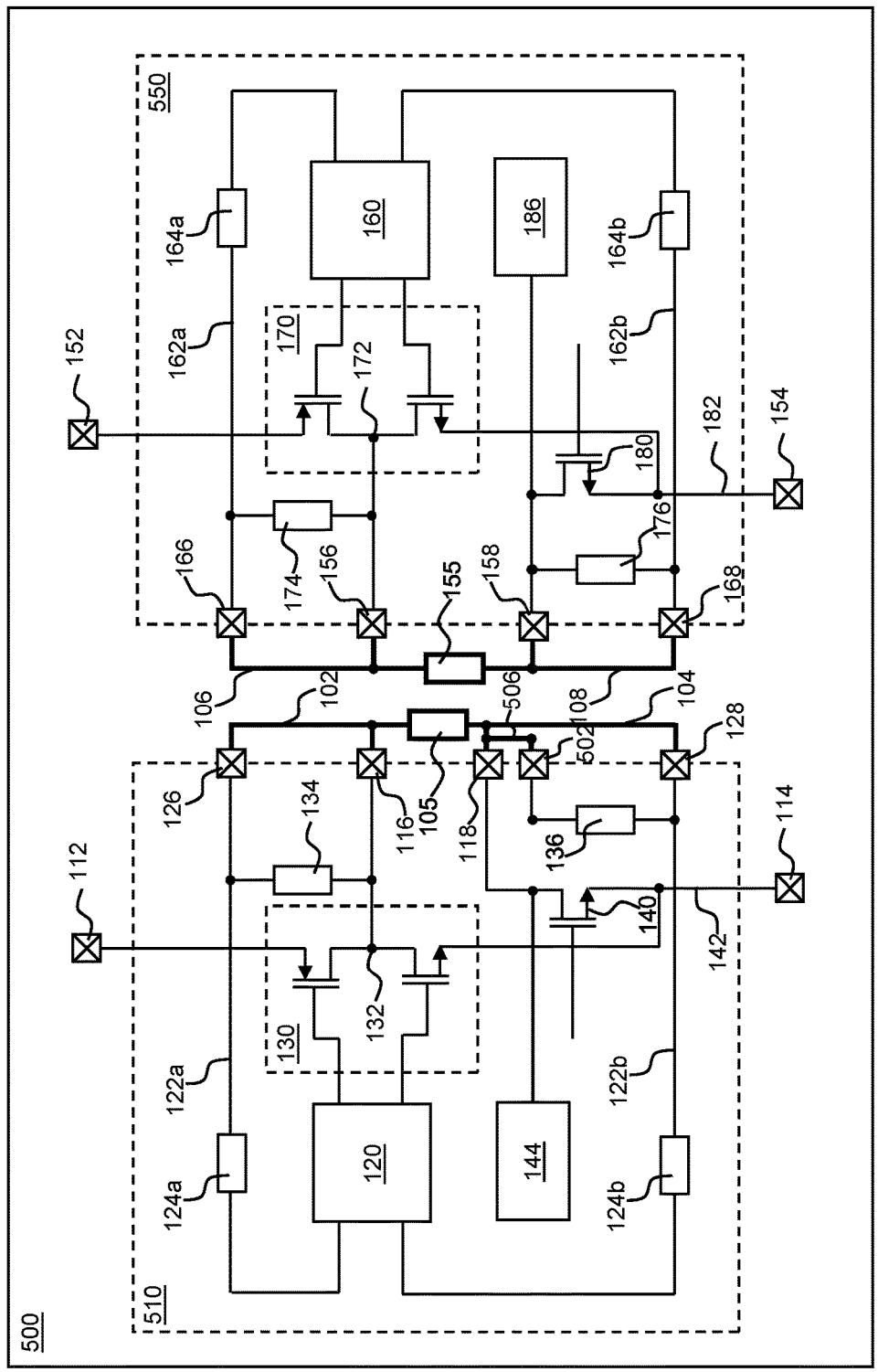
FIG. 6 is a schematic representation of the integrated circuit of FIG. 5 configured as two single ended half-bridge amplifiers.

FIG. 6 is a schematic representation of the IC 500 of FIG. 5 reconfigured as two separate single ended half-bridge amplifiers, each for driving a respective external load 105, 155.

In the configuration shown in FIG. 6, a first external load 105 is coupled between the first amplifier output terminal 116 and the first amplifier return terminal 118 of the first amplifier circuitry 510. A first external link or connection 102 may be provided to couple the first amplifier output terminal 116 to the first voltage sense terminal 126 of the first amplifier circuitry 110, thereby providing a feedback path (containing only the first feedback resistor 124a) between the first amplifier output terminal 116 and the first input of the first input stage 120.

A second external link or connection 104 may be provided to couple the first amplifier return terminal 118 to the second voltage sense terminal 128 of the first amplifier circuitry 110, thereby providing a feedback path (containing only the second feedback resistor 124b) between the first return terminal 118 and the second input of the first input stage 120.

A seventh external link or connection 506 is provided to couple the first amplifier return terminal 118 to the shunt resistor terminal 502.

Thus, in the single ended configuration shown in FIG. 6, if the first external link or connection 102 is not provided or fails, a feedback path containing the first shunt resistor 134 and the first feedback resistor 124a exists between the output node 132 of the first half-bridge output stage 130 and the first input of the first input stage 120. Similarly, if the second external link 104 or connection is not provided or fails, a feedback path containing the second shunt resistor 136 and the second feedback resistor 124b exists between the first amplifier return terminal 118 and the second input of the first input stage 120, via the shunt resistor terminal 502.

The second amplifier circuitry 550 is configured in the same way as the second amplifier circuitry 110 described above with reference to FIG. 1, with a second external load 155 coupled between the second amplifier output terminal 156 and the second amplifier return terminal 158. A third external link or connection 106 may be provided to couple the second amplifier output terminal 156 to the first voltage sense terminal 166 of the second amplifier circuitry 150. A fourth external link or connection 108 may be provided to couple the second return terminal 158 to the second voltage sense terminal 168 of the second amplifier circuitry 550. The third and fourth shunt resistors 174, 176 of the second amplifier circuitry 550 provide alternative feedback paths between the second amplifier output terminal 156 and the first input of the second input stage 160 and between the second return terminal and the second input of the second input stage 160 as described above with reference to FIG. 1.

Thus, as will be apparent to those of ordinary skill in the art, the additional dedicated shunt resistor terminal 502 provided in the first amplifier circuitry 510 of the IC 500 does not affect the ability of the IC 500 to be configured as two single-ended half-bridge amplifiers for driving the separate loads 105, 155, but provides an additional feedback path that can be used to prevent open-loop operation of the first amplifier circuitry 110 when the IC 500 is configured as a differential full-bridge amplifier.

Figure 7:
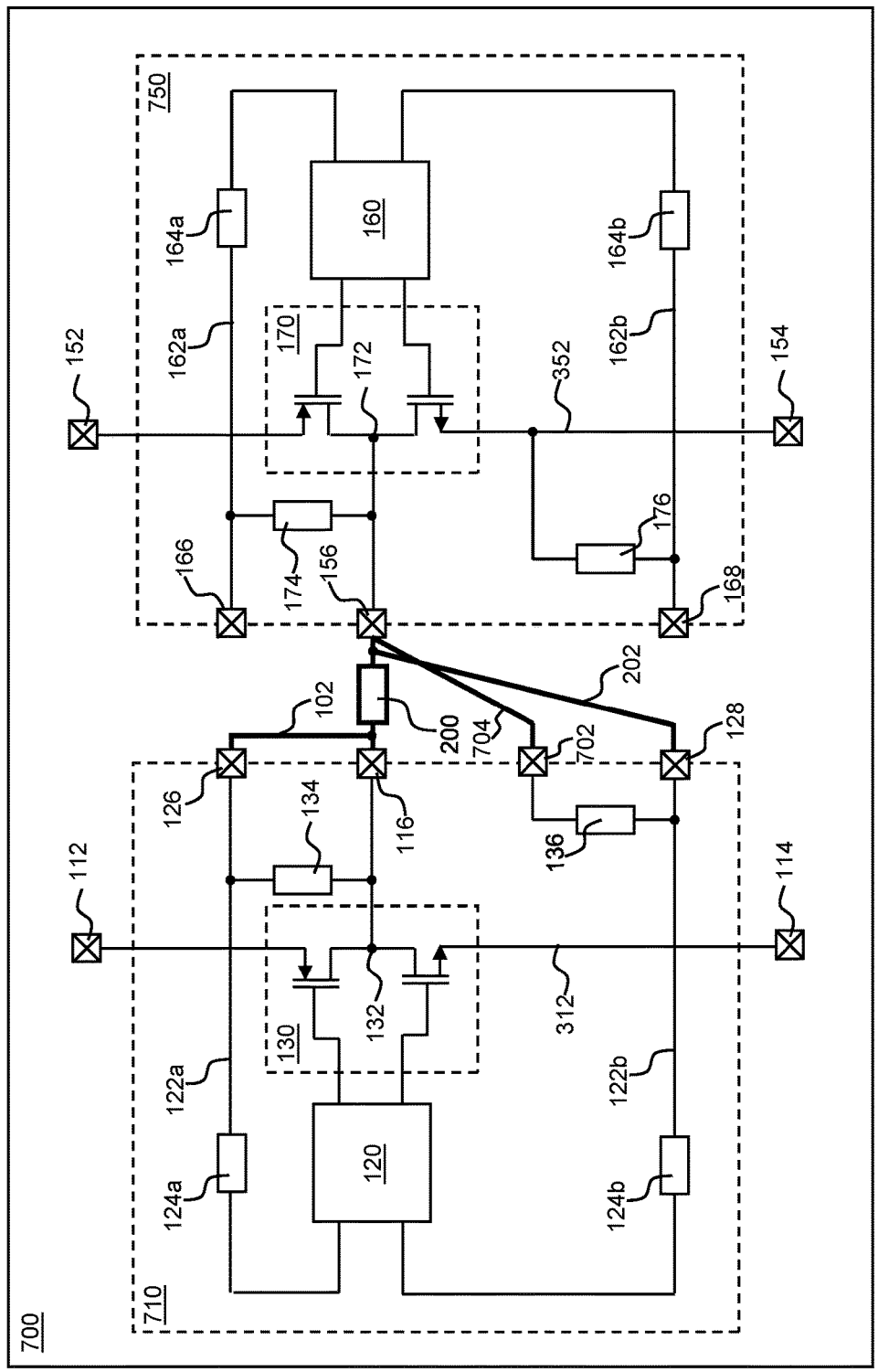
FIG. 7 is a schematic representation of a further alternative integrated circuit implementation of amplifier circuitry configured as a full-bridge differential amplifier according to the present disclosure.

FIG. 7 is a schematic diagram illustrating a further alternative IC implementation of amplifier circuitry configured as a differential full-bridge amplifier for driving a single external load 200. The IC, shown generally at 700 in FIG. 7, includes a number of features in common with the IC 300 of FIGS. 3 and 4. Such common features are denoted by common reference numerals in FIGS. 3, 4 and 7, and will not be described again in detail here for the sake of clarity and brevity.

The IC 700 comprises first and second amplifier circuitry 710, 750 that are similar to the first and second amplifier circuitry 310, 350 described above with reference to FIG. 3.

In the IC 700 of FIG. 7, the first terminal of the second shunt resistor 136 of the first amplifier circuitry 710 is not coupled to the first amplifier ground path 312 of the first amplifier circuitry 710.

Instead, the first amplifier circuitry 710 includes a dedicated shunt resistor terminal 702 (e.g. a pin, pad, ball or the like) to which only a first terminal of the second shunt resistor 136 is coupled, such that the first terminal of the second shunt resistor 136 is directly accessible from outside the IC 700.

A second terminal of the second shunt resistor 136 is coupled to the second voltage sense terminal 128 of the first amplifier circuitry 710, as in the implementations shown in FIGS. 1-6.

In the differential configuration shown in FIG. 7, a fifth external link or connection 202 is provided to couple the second amplifier output terminal 156 of the second amplifier circuitry 750 to the second voltage sense terminal 128 of the first amplifier circuitry 710 (as in the differential configuration of the IC 100, 300, 500 shown in FIGS. 2, 4 and 5), to provide a feedback path between the second amplifier output terminal 156 and the second input of the first input stage 120.

Additionally, the dedicated shunt resistor terminal 702 is coupled to the second amplifier output terminal 156 of the second amplifier circuitry 750 by an eighth external link or connection 704.

Thus, in the implementation shown in FIG. 7, in the event that the fifth external link or connection 202 fails or is not provided for any reason, a feedback path between the second amplifier output terminal 156 and the second input of the first input stage 120 still exists, via the eighth external link or connection 704 and the second shunt resistor 136 of the first amplifier circuitry 710. Accordingly, in the differential configuration shown in FIG. 7 the first amplifier circuitry 710 always operates in a closed loop configuration.

In operation of the IC 700 in the differential configuration shown in FIG. 7 the external load 200 is coupled between the first amplifier output terminal 116 and the second amplifier output terminal 156, and the first input stage 120 provides input signals to both the first half-bridge output stage 130 and the second half-bridge output stage 170, such that the external load 200 is driven by a differential output signal pair provided by the first and second first half-bridge output stages 130, 170. The second input stage 160 is not used.

Figure 8:
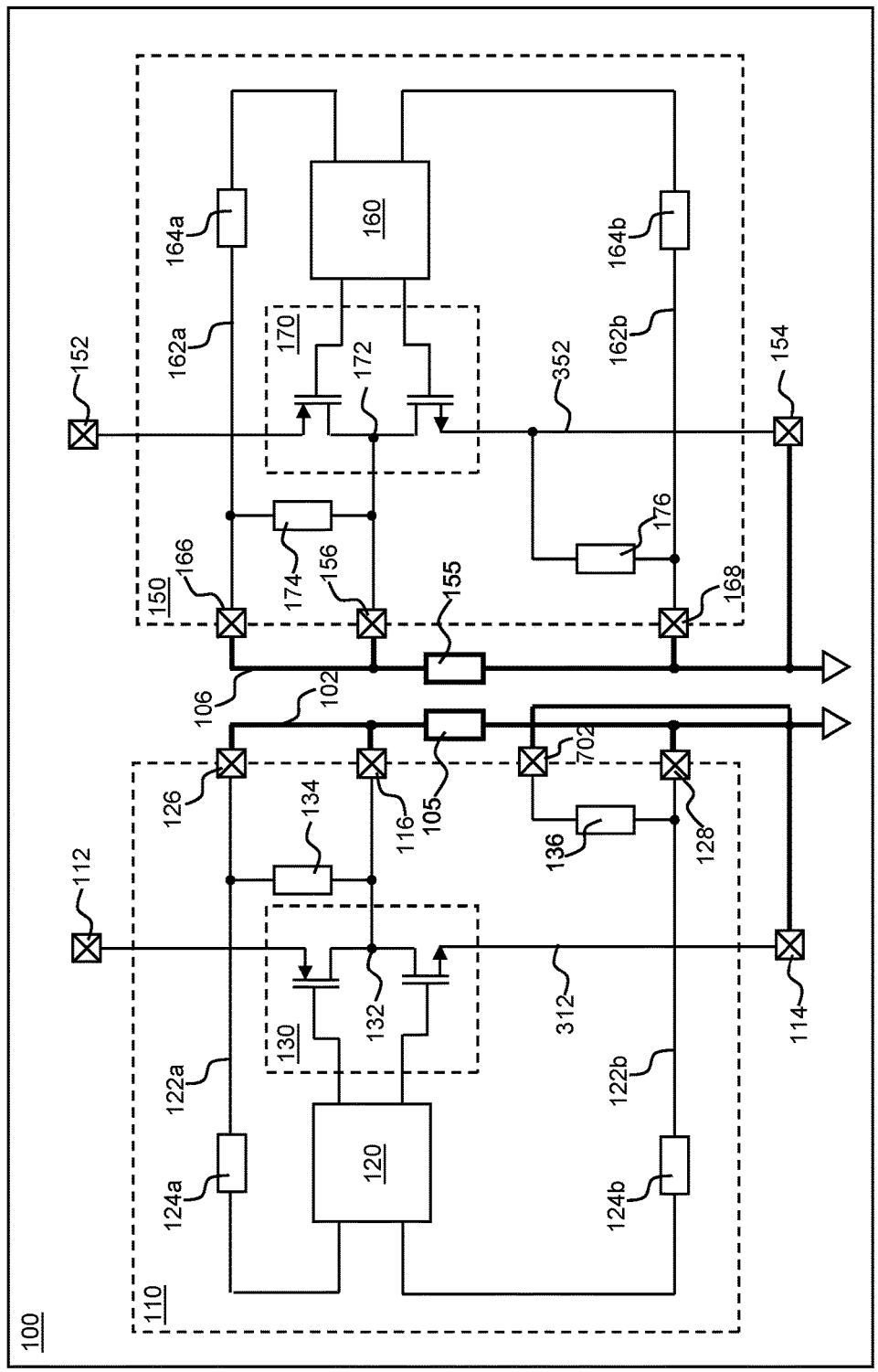
FIG. 8 is a schematic representation of the integrated circuit of FIG. 7 configured as two single ended half-bridge amplifiers.

FIG. 8 is a schematic representation of the IC 700 of FIG. 7 reconfigured as two separate single-ended half-bridge amplifiers, each for driving a respective load 105, 155.

In the configuration shown in FIG. 8, a first terminal of a first external load 105 (e.g. a transducer such as a speaker or an actuator such as a linear resonant actuator) is coupled to the first amplifier output terminal 116. A second terminal of the first external load 105 is coupled to the ground or other reference voltage supply terminal 114 of the first amplifier circuitry 710. The second terminal of the first external load 105 is also coupled to the second voltage sense terminal 128 of the first amplifier circuitry 710. A first external link or connection 102 may be provided, coupled between the first amplifier output terminal 116 and the first voltage sense terminal 126 of the first amplifier circuitry 710.

Thus, a feedback path is provided from the output node 132 of the first half-bridge output stage 130 to the first input of the first input stage 120, either via the first external link or connection 102 (if provided) and the first feedback resistor 124a or via the first shunt resistor 134 and the first feedback resistor 124a if the first external link or connection 102 is not provided.

A feedback path is also provided from the second terminal of the first external load 105 to the second input of the first input stage 120, via the second feedback resistor 124b.

The second amplifier circuitry 750 is configured in the same way as the second amplifier circuitry 310 described above with reference to FIG. 3, with a second external load 155 coupled between the second amplifier output terminal 156 and the ground or other reference voltage supply terminal 154 of the second amplifier circuitry 750. A third external link or connection 106 may be provided to couple the second amplifier output terminal 156 to the first voltage sense terminal 166 of the second amplifier circuitry 750.

Thus, a feedback path is provided from the output node 172 of the second half-bridge output stage 170 to the first input of the second input stage 160, either via the third external link or connection 106 (if provided) and the third feedback resistor 164a or via the third shunt resistor 174 and the third feedback resistor 164a if the third external link or connection 106 is not provided.

A feedback path is also provided from the second terminal of the second external load 155 to the second input of the second input stage 160, via the fourth feedback resistor 164b.

Thus, as will be apparent to those of ordinary skill in the art, the additional dedicated shunt resistor terminal 702 provided in the first amplifier circuitry 710 of the IC 700 does not affect the ability of the IC 700 to be configured as two single-ended half-bridge amplifiers for driving the separate loads 105, 155, but provides an additional feedback path that can be used to prevent open-loop operation of the first amplifier circuitry 710 when the IC 700 is configured as a differential full-bridge amplifier.

Figure 9:
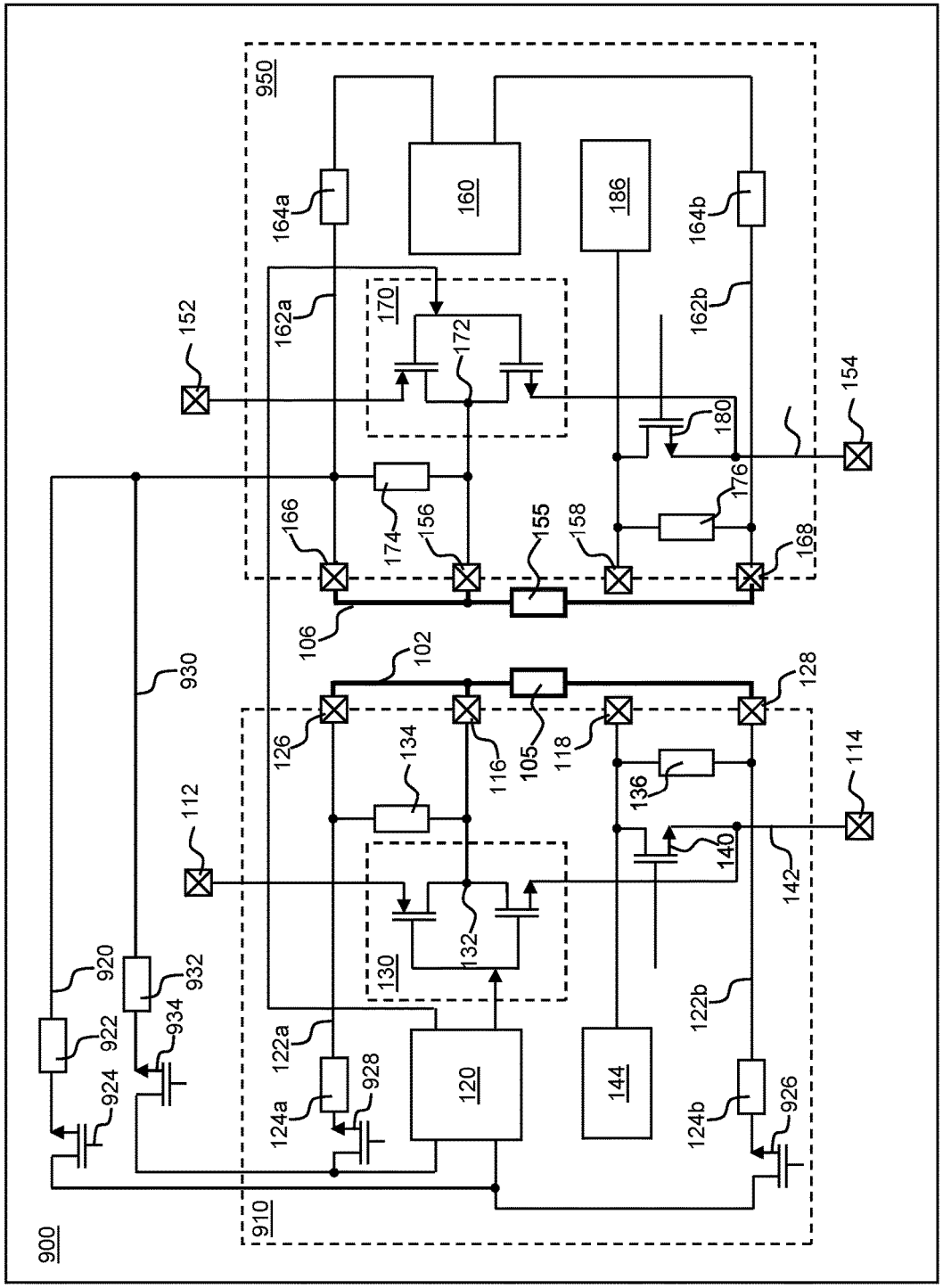
FIG. 9 is a schematic representation of a further alternative integrated circuit implementation of amplifier circuitry comprising two single ended half-bridge amplifiers configurable as single ended amplifiers or as a differential amplifier according to the present disclosure.

FIG. 9 is a schematic diagram illustrating an alternative IC implementation of amplifier circuitry configurable for driving a single ended or differential external load. In the example shown in FIG. 9, the amplifier circuitry is configured as two single ended half-bridge amplifiers.

The IC, shown generally at 900 in FIG. 9, includes a number of features in common with the IC 100 of FIGS. 1 and 2. Such common features are denoted by common reference numerals in FIGS. 1, 2 and 9, and will not be described again in detail here for the sake of clarity and brevity.

The IC 900 comprises first and second amplifier circuitry 910, 950 that are similar to the first and second amplifier circuitry 110, 150 described above with reference to FIG. 1.

The IC 900 differs from the IC 100 of FIGS. 1 and 2 in that it includes a selectable feedback path 920 for coupling the output node 172 of the second output stage 170 to the second input of the first input stage 120, via the third shunt resistor 174 of the second amplifier circuitry 950.

Thus, the selectable feedback path 920 enables the third shunt resistor 174 of the second amplifier circuitry 150 to be used as a feedback resistor when the first and second amplifier circuitry 910, 950 are configured as a differential full-bridge amplifier for driving the load.

The selectable feedback path 920 includes a feedback resistor 922 and a first feedback path selector switch 924, and is coupled, at a first end thereof, to the second input of the first input stage 120. A second end of the selectable feedback path 920 is coupled to the first terminal of the third shunt resistor 174 of the second amplifier circuitry 950.

The IC 900 further includes a second feedback path selector switch 926 in the second feedback path 122b of the first amplifier circuitry 910 and a third feedback path selector switch 928 in the first feedback path 122a of the first amplifier circuitry 910.

In some examples the IC 900 may further include an additional dummy feedback path 930 for coupling the output node 172 of the second output stage 170 to the first input of the first input stage 120, via the third shunt resistor 174 of the second amplifier circuitry 950. The additional dummy feedback path 930 includes a dummy feedback resistor 932 and a dummy feedback path selector switch 934.

The purpose of the additional dummy feedback path 930 is to balance the effect of the selectable feedback path 920 when the first amplifier circuitry 910 is configured as a single-ended half-bridge amplifier, to ensure that the impedance of the selectable feedback path 920 seen by the second input of the first input stage 120 is matched by an equivalent impedance seen by the first input of the first input stage 120. To this end, the resistance of the dummy feedback resistor 932 is equal to the resistance of the feedback resistor 922, and the characteristics of the dummy feedback path selector switch 934 are matched to those of the first feedback path selector switch 924.

When the IC 900 is in its differential full-bridge amplifier configuration, the load is coupled between the first amplifier output terminal 116 of the first amplifier circuitry 910 and the first amplifier output terminal 156 of the second amplifier circuitry 950. The first input stage 120 provides input signals to both the first half-bridge output stage 130 and the second first half-bridge output stage 170, such that the load 200 is driven by a differential output signal pair provided by the first and second first half-bridge output stages 130, 170. The second input stage 160 is not used.

The first feedback path 122a is coupled to the output node 132 of the output stage 130 of the first amplifier circuitry 910, either by the first external link or connection 102 or, if the first external link or connection 102 is not provided or is broke, by the first shunt resistor 132 of the first amplifier circuitry 910, and the third feedback path selector switch 928 is closed.

The first feedback path selector switch 924 is closed, such that the selectable feedback path 920 couples the output node 172 of the output stage 170 of the second amplifier circuitry 950 to the second input of the input stage 120 of the first amplifier circuitry 910, either via the third external link or connection 106 and the feedback resistor 922 of the selectable feedback path 920 or, if the third external link or connection 108 is not provided or is broken, via the third shunt resistor 174 of the second amplifier circuitry 950 and the feedback resistor 922 of the selectable feedback path 920.

The second feedback path selector switch 926 is opened, to decouple the second input of the first input stage 120 from the second feedback path 122b of the first amplifier circuitry 910.

Thus, in the implementation shown in FIG. 9, in the event that the third external link or connection 106 fails or is not provided for any reason, a feedback path between the second amplifier output terminal 156 and the second input of the first input stage 120 still exists, via the third shunt resistor 174 of the second amplifier circuitry 950. Accordingly, in the differential configuration shown in FIG. 9 the first amplifier circuitry 910 always operates in a closed loop configuration.

The IC 900 of FIG. 9 can also be configured to provide two single-ended half-bridge amplifiers for driving separate loads. In this configuration the first feedback path selector switch 924 is opened and the second and third feedback path selector switches 926, 928 are closed, such that the IC 900 adopts the configuration shown in FIG. 9. As noted above, in this configuration the impedance of the dummy feedback path 930 seen at the second input of the first input stage 210 matches the impedance of the selectable feedback path 920 seen at the first input of the first input stage 210.

In the examples described above and illustrated in FIGS. 1-9 the first and second amplifier circuitry is described as being provided on a single IC (e.g. IC 100, 300, 500, 700, 900). However it will be appreciated that in other examples the first amplifier could be provided on a first IC and the second amplifier circuitry could be provided on a second IC.

As will be apparent from the foregoing description, the circuitry of the present disclosure ensures that feedback paths are provided between the first terminal of the load 200 and the first input of the first input stage 120 and between the second terminal of the load 200 and the second input of the first input stage 120 when the first and second amplifier circuitry are used together to implement a full-bridge differential amplifier for driving a single load 200, thus preventing unintended open-loop operation of the amplifier.

The circuitry described above with reference to the accompanying drawings may be incorporated in a host device such as a laptop, notebook, netbook or tablet computer, a gaming device such as a games console or a controller for a games console, a virtual reality (VR) or augmented reality (AR) device, a mobile telephone, a portable audio player or some other portable device, or may be incorporated in an accessory device for use with a laptop, notebook, netbook or tablet computer, a gaming device, a VR or AR device, a mobile telephone, a portable audio player or other portable device.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Integrated circuitry implementing amplifier circuitry, the integrated circuity comprising first amplifier circuitry and second amplifier circuitry, the first and second amplifier circuitry being configurable as first and second single-ended amplifiers or as a differential amplifier,
wherein the first amplifier circuitry comprises:
a first input stage;
a first half-bridge output stage having an output coupled to a first output terminal of the integrated circuitry;
a first feedback path coupling a first input of the first input stage to a first sense terminal of the first amplifier circuitry;
a second feedback path coupling a second input of the first input stage to a second sense terminal of the first amplifier circuitry; and
a first shunt resistor coupling the output of the first half-bridge output stage to the first feedback path,
wherein the second amplifier circuitry comprises:
a second input stage; and
a second half-bridge output stage having an output coupled to a second output terminal of the integrated circuitry,
and wherein the first amplifier circuitry further comprises a second shunt resistor coupling the second feedback path to a dedicated shunt resistor terminal of the integrated circuitry, such that the second shunt resistor is directly accessible from outside the integrated circuitry.

2. The integrated circuitry according to claim 1, wherein:
the first amplifier circuitry comprises a first return path switch in a first return path, for selectively coupling an amplifier return terminal of the first amplifier circuitry to a ground or reference volage supply terminal of the first amplifier circuitry; and/or
the second amplifier circuitry comprises a second return path switch in a second return path for selectively coupling an amplifier return terminal of the second amplifier circuitry to a ground or reference volage supply terminal of the second amplifier circuitry.

3. The integrated circuitry according to claim 2, wherein:
the first amplifier circuitry comprises load sensing circuitry coupled to the amplifier return terminal of the first circuitry, for determining a parameter of a load coupled to the first output terminal; and/or
the second amplifier circuitry comprises load sensing circuitry coupled to the amplifier return terminal of the second circuitry, for determining a parameter of a load coupled to the second output terminal.

4. The integrated circuitry according to claim 1, wherein the first amplifier circuitry comprises Class D amplifier circuitry.

5. The integrated circuitry according to claim 1, wherein the first input stage comprises pulse width modulator circuitry.

6. The integrated circuitry according to claim 1, wherein the second amplifier circuitry further comprises:
a second input stage;
a third feedback path coupling a first input of the second input stage to a first sense terminal of the second amplifier circuitry;
a fourth feedback path coupling a second input of the second input stage to a second sense terminal of the second amplifier circuitry;
a third shunt resistor coupling the output of the second half-bridge output stage to the third feedback path; and
a fourth shunt resistor coupling the fourth feedback path to an amplifier return terminal of the second amplifier circuitry.

7. The integrated circuitry according to claim 6, wherein the second amplifier circuitry comprises class D amplifier circuitry.

8. The integrated circuitry according to claim 7, wherein the second input stage comprises pulse width modulator circuitry.

9. The integrated circuitry according to claim 1, wherein in operation of the integrated circuitry when configured as a differential amplifier, the first input stage is configured to supply input signals to the first half-bridge output stage and to the second half-bridge output stage.

10. The integrated circuitry according to claim 1, wherein in operation of the integrated circuitry when configured as first and second single-ended amplifiers, the first input stage is configured to supply an input signal to the first half-bridge output stage and the second input stage is configured to supply an input signal to the second half-bridge output stage.

11. Reconfigurable amplifier circuitry comprising:
a first amplifier comprising:
a first input stage;
a first output stage;
a first feedback path coupled to a first input of the first input stage;
a second feedback path coupled to a second input of the first input stage;
a first resistor coupling an output node of the first output stage to the first feedback path; and
a second resistor coupled between a dedicated resistor node and the second feedback path; and
a second amplifier comprising:
a second input stage;
a second output stage;
a third feedback path coupled to a first input of the second input stage;
a fourth feedback path coupled to a second input of the first input stage;
a third resistor coupling an output node of the second output stage to the third feedback path; and
a fourth resistor coupled between an amplifier return terminal and the fourth feedback path;
wherein the reconfigurable amplifier circuitry is operable in:
a first configuration as first and second amplifiers for driving respective first and second loads coupled to the respective output nodes of the first and second output stages; and
a second configuration for differentially driving a single load coupled between the respective output nodes of the first and second output stages,
wherein in the second configuration the output node of the second output stage is coupled to the dedicated resistor node of the first amplifier circuitry.

12. Reconfigurable amplifier circuitry comprising:
first amplifier circuitry comprising a first input stage, a first output stage and a feedback path coupling an output node of the first output stage to a first input of the first input stage, wherein the feedback path comprises a first shunt resistor;
second amplifier circuitry comprising a second input stage, a second output stage and a feedback path coupling an output node of the second output stage to a first input of the second input stage, wherein the feedback path comprises a second shunt resistor; and
a selectable feedback path coupling the output node of the second output stage to a second input of the first input stage,
wherein:
in a first configuration the reconfigurable amplifier circuitry is operable as first and second single-ended amplifiers for driving respective first and second loads, wherein in the first configuration the selectable feedback path is disabled, the first input stage is operative to supply a first input signal to the first output stage and the second input stage is operative to supply a second input signal to the second output stage; and
in a second configuration the reconfigurable amplifier circuitry is operable as a differential amplifier for driving a single load, wherein in the second configuration the selectable feedback path is enabled and the first input stage is operative to supply input signals to the first and second output stages.

13. The reconfigurable amplifier according to claim 12, wherein the first amplifier circuitry comprises a selectable second feedback path between a first amplifier return terminal and the second input of the first input stage, wherein in the first configuration the selectable second feedback path is enabled, and wherein in the second configuration the selectable second feedback path is disabled.

14. An integrated circuit comprising the reconfigurable amplifier circuitry according to claim 11.

15. An integrated circuit comprising the reconfigurable amplifier circuitry according to claim 12.

16. An integrated circuit comprising first amplifier circuitry, second amplifier circuitry and a shunt resistor associated with the first amplifier circuitry, wherein the integrated circuit is configured such that the first amplifier circuitry and the second amplifier circuitry are selectively configurable in either:
- a first configuration to implement separate first and second single-ended amplifier circuitry for driving respective separate first and second loads; or
- a second configuration to implement differential amplifier circuitry for driving a single load, and
- wherein the integrated circuit includes a dedicated shunt resistor terminal to which only a first terminal of the shunt resistor is coupled, to permit external access to the shunt resistor.

17. A host device comprising the integrated circuitry according to claim 1.

18. The host device according to claim 17, wherein the host device comprises a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console, a VR or AR device, a mobile telephone, a portable audio player or other portable device.

* * * * *